United States Patent [19]

Obuse

[11] Patent Number: 5,767,048
[45] Date of Patent: Jun. 16, 1998

[54] CLEANING PROCESS

[75] Inventor: Hiroshi Obuse, Tokyo, Japan

[73] Assignee: Kurita Water Industries Ltd., Tokyo, Japan

[21] Appl. No.: 864,443

[22] Filed: May 28, 1997

Related U.S. Application Data

[62] Division of Ser. No. 542,734, Oct. 13, 1995, abandoned.

[30] Foreign Application Priority Data

Feb. 23, 1995 [JP] Japan ................... 7-059803

[51] Int. Cl.$^6$ ................... B08B 3/08; C23G 5/036; C23G 5/032; C23G 5/024
[52] U.S. Cl. ................... 510/175; 510/176; 510/177; 510/178; 510/407; 510/409; 510/436; 510/467; 510/493; 510/500
[58] Field of Search ................... 510/175, 176, 510/178, 409, 436, 467, 493, 407, 500, 177, 411

[56] References Cited

U.S. PATENT DOCUMENTS

| | | | |
|---|---|---|---|
| 4,276,186 | 6/1981 | Bakds et al. | 252/158 |
| 4,617,251 | 10/1986 | Sizensky | 430/256 |
| 4,729,797 | 3/1988 | Linde et al. | 134/38 |
| 4,731,262 | 3/1988 | Ohno et al. | 427/379 |
| 4,952,559 | 8/1990 | Login et al. | 512/10 |
| 4,983,224 | 1/1991 | Mombrun et al. | 134/40 |
| 5,011,620 | 4/1991 | Dishart et al. | 252/118 |
| 5,093,031 | 3/1992 | Login et al. | 510/182 |
| 5,288,727 | 2/1994 | Toki et al. | 514/632 |
| 5,431,847 | 7/1995 | Winston et al. | 252/174.24 |
| 5,486,314 | 1/1996 | Wack et al. | 510/407 |
| 5,561,215 | 10/1996 | Pourreau | 528/373 |
| 5,688,753 | 11/1997 | Cala et al. | 510/175 |

FOREIGN PATENT DOCUMENTS

| | | |
|---|---|---|
| 3-146597 | 6/1991 | Japan. |
| 6340895 | 12/1994 | Japan. |

*Primary Examiner*—Jerry D. Johnson
*Attorney, Agent, or Firm*—Frishauf, Holtz, Goodman, Langer & Chick, P.C.

[57] ABSTRACT

A cleaning process which comprises contacting a printed circuit board to which a residue of a flux is attached with a cleaning composition containing a first solvent and an organic compound, and then with a second solvent. The first solvent is an aliphatic hydrocarbon solvent having 5 to 20 carbon atoms. The organic compound is a 1-alkyl-2-pyrrolidone having 3 to 18 carbon atoms, a tri-alkylphosphine oxide having 3 to 8 carbon atoms or a di-alkylsulfoxide having 3 to 8 carbon atoms. The organic compound is in an amount of 10 to 300 g per liter of the hydrocarbon solvent. The cleaning composition does not contain a halogen compound.

13 Claims, No Drawings

1

CLEANING PROCESS

This application is a Division of application Ser. No. 08/542,734, filed Oct. 13, 1995 now abandoned.

FIELD OF THE INVENTION

The present invention relates to a composition for cleaning and a process for cleaning. More particularly, it relates to a composition for cleaning which is based on an organic solvent, does not contain any halogen compound, has an excellent cleaning ability, and suitable for cleaning printed circuit boards in particular, and a process for cleaning using said composition for cleaning.

PRIOR ART OF THE INVENTION

When electronic parts are soldered to a printed circuit board, a flux is used in order to remove an oxide layer on the surface of the solder as well as to prevent oxidation of the solder after the soldering. Residue formed from the flux after the soldering contains ionic substances, which causes corrosion of printed circuits and deterioration of electric insulation. Therefore, it is necessary that a printed circuit board be cleaned thoroughly to remove the residue after the soldering.

Heretofore, organic chlorinated solvents, such as 1,1,1-trichloroethane and the like, and chlorofluorocarbon solvents, such as CFC-113, have widely been used as the cleaning agent for removing the residue. However, it has been made clear that these solvents cause destruction of the ozonosphere, and it has been decided that use of these solvents be totally prohibited by the end of 1995. Because of this situation, development of novel cleaning agents which can replace these solvents has urgently been desired.

As cleaning agents which can replace organic chlorinated solvents and chlorofluorocarbon solvents, watery solvents and hydrocarbon solvents are becoming popular. However, watery solvents require a treatment for water disposal and a process for drying, and are disadvantageous in view of cost. Hydrocarbon solvents are inferior in the cleaning ability to remove residue of a flux because of low solubility of ionic substances, and have not generally been used, even though these solvents have advantages in that they have lower toxicity than that of other cleaning solvents, show little effect on resin materials of printed circuit boards, and are relatively inexpensive. A process for enhancing cleaning ability of an aliphatic hydrocarbon having 8 to 20 carbon atoms in average by adding an organic compound having a polar group, such as an alcohol, an ether, an ester, a carboxylic acid, or a ketone, has been proposed (Japanese Patent Application Laid-Open No. Heisei 3(1991)-146597). However, the cleaning ability of this process is not always sufficient.

SUMMARY OF THE INVENTION

The present invention accordingly has an object to provide a composition for cleaning which can replace conventional organic halogenated solvents, does not cause destruction of the ozonosphere, and has excellent cleaning ability to remove residue of a flux.

The present invention also has an object to provide a process for cleaning having the same advantages described above.

Extensive investigations undertaken by the present inventors with the objects described above lead to a discovery that a cleaning effect which is equal to or higher than that of organic halogenated solvents, such as chlorofluorocarbons, trichloroethane, and the like, can be obtained when a hydrocarbon solvent is used in combination with an organic compound which can coordinate to metal ions. The present invention has been completed on the basis of the discovery.

Thus, the present invention provides:

(1) A composition for cleaning comprising a hydrocarbon solvent and an organic compound which can coordinate to metal ions;

(2) A composition for cleaning described in (1), wherein the hydrocarbon solvent is an aliphatic hydrocarbon having 5 to 20 carbon atoms;

(3) A composition for cleaning described in (1) or (2), wherein the organic compound which can coordinate to metal ions is a coordinating compound having an oxygen atom as an atom of coordination;

(4) A composition for cleaning described in (3), wherein the coordinating compound having an oxygen atoms as an atom of coordination is one or more compounds selected from 1-alkyl-2-pyrrolidinones, trialkylphosphine oxides, and dialkylsulfoxides;

(5) A composition for cleaning described in (4), wherein the alkyl group in 1-alkyl-2-pyrrolidinones, trialkylphosphine oxides, and dialkylsulfoxides is a linear alkyl group having 3 to 18 carbon atoms;

(6) A composition for cleaning described in (1), wherein the composition for cleaning is used for removing residue of a flux attached to printed circuit boards;

(7) A composition for cleaning described in (1), (2), (3), (4), or (5), wherein the composition for cleaning contains the organic compound which can coordinate to metal ions in an amount of 10 to 300 g per 1 liter of the hydrocarbon solvent;

(8) A process for cleaning which comprises bringing an article for cleaning into contact with a composition for cleaning comprising a hydrocarbon solvent and an organic compound which can coordinate to metal ions, and subsequently bringing the article for cleaning into contact with a solvent;

(9) A process for cleaning described in (8), wherein the hydrocarbon solvent is an aliphatic hydrocarbon having 5 to 20 carbon atoms;

(10) A process for cleaning described in (8) or (9), wherein the organic compound which can coordinate to metal ions is a coordinating compound having an oxygen atom as an atom of coordination;

(11) A process for cleaning described in (10), wherein the coordinating compound having an oxygen atoms as an atom of coordination is one or more compounds selected from 1-alkyl-2-pyrrolidinones, trialkylphosphine oxides, and dialkylsulfoxides;

(12) A process for cleaning described in (11), wherein the alkyl group in 1-alkyl-2-pyrrolidinones, trialkylphosphine oxides, and dialkylsulfoxides is a linear alkyl group having 3 to 18 carbon atoms; and

(13) A process for cleaning described in (8), wherein the article for cleaning is a printed circuit board to which residue of a flux is attached.

(14) A process for cleaning according to (8), (9), (10), (11), or (12), wherein the composition for cleaning contains the organic compound which can coordinate to metal ions in an amount of 10 to 300 g per 1 liter of the hydrocarbon solvent.

DETAILED DESCRIPTION OF THE INVENTION

The hydrocarbon solvent used in the present invention is not particularly limited as long as the hydrocarbon solvent can dissolve residue of a flux. Examples of the hydrocarbon solvent include paraffinic hydrocarbons, such as n-pentane, n-hexane, isohexane, n-heptane, isoheptane, isooctane, decane, dodecane, hexadecane, icosan, and the like; olefinic hydrocarbons, such as 1-decene, 1-dodecene, and the like; naphthenic hydrocarbons, such as cyclohexane, decalin, and the like; terpene hydrocarbons, such as limonene, pinene, and the like; aromatic hydrocarbons, such as benzene, toluene, xylene, ethylbenzene, tetralin, and the like; petroleum ether; petroleum benzine; ligroin; solvent naphtha; and the like. In the present invention, the hydrocarbon solvent may be used singly or as a mixture of two or more types. Among these hydrocarbon solvents, aliphatic hydrocarbons having 5 to 20 carbon atoms have superior cleaning ability, and can be used preferably. When safety is emphasized, it is desirable that a solvent having a flash point of 70° C. or higher (a solvent classified into the third petroleum material in the fourth class, according to the Japanese Fire Services Act), is used. In the present invention, the hydrocarbon solvent used for the composition for cleaning comprising an organic compound which can coordinate to metal ions may be the same as or different from the solvent which is brought into contact with an article for cleaning after the article for cleaning has been brought into contact with the composition for cleaning.

The organic compound which can coordinate to metal ions used in the present invention is not particularly limited as long as the compound can be dissolved in the hydrocarbon solvent. Examples of the organic compound which can coordinate to metal ions (hereinafter referred to as a coordinating compound) include compounds having an oxygen atom as an atom of coordination, such as 1-alkyl-2-pyrrolidinone, trialkylphosphine oxide, dialkylsulfoxide, and the like. It is preferred that the alkyl group in the compounds described above is a linear alkyl group having 3 to 18 carbons, although the alkyl group may have short side chains. Specific examples of the coordinating compound include 1-n-octyl-2-pyrrolidionone (NOP), 1-n-dodecyl-2-pyrrolidinone (NDP), tri-n-octylphosphine oxide (TOPO), di-n-butylsulfoxide (DBSO), tri-n-butylphosphine oxide (TBPO), and the like. The composition for cleaning of the present invention may comprise a single type of the coordinating compound or two or more types of the coordinating compounds. The composition for cleaning comprises the coordinating compound preferably in an amount of 10 to 300 g, more preferably in an amount of 30 to 250 g, per 1 liter of the hydrocarbon solvent. When the coordinating compound is comprised in an amount of less than 10 g per 1 liter of the hydrocarbon solvent, there is the possibility that sufficient cleaning ability is not exhibited. When the coordinating compound is comprised in an amount of more than 300 g per 1 liter of the hydrocarbon solvent, the cleaning ability is not so much increased as expected from the amount comprised, but is occasionally decreased contrary to the expectation, there is the possibility that the resin of the printed circuit board is adversely affected by the composition, and furthermore a larger amount of a rinsing fluid is required after the cleaning.

The composition for cleaning of the present invention may comprise other components when necessary. Examples of such other component include surfactants, anticorrosion agents, and the like. As the surfactant, lipophilic nonionic surfactants having lower HLB values are advantageously used. Examples of such surfactant include polyoxyethylene alkyl ethers, alkylamine oxides, silicone surfactants, such as silicones modified with polyethers, and the like. Examples of the anticorrosion agent include mercaptobenzothiazole, benzotriazole, and the like.

In the process for cleaning of the present invention, an article for cleaning is first brought into contact with the composition for cleaning comprising a hydrocarbon solvent and a coordinating compound. The process for cleaning of the present invention exhibits particularly excellent effect when the article for cleaning is a printed circuit board which has been coated with a flux and soldered. Residue of the flux attached to the printed circuit board can be efficiently removed. The manner in which the article for cleaning is brought into contact with the composition for cleaning is not particularly limited. For example, the article for cleaning may be dipped into the composition for cleaning, or the composition for cleaning may be sprayed on the article for cleaning. When the article for cleaning is dipped into the composition for cleaning, the cleaning can be accelerated by stirring, shaking, irradiating with ultrasonic wave, or the like, when necessary. When the article for cleaning is a printed circuit board to which residue of a flux is attached, metal components in the residue of a flux are dissolved by forming metal complexes with the coordinating compound, and removed from the surface of the printed circuit board.

In the process for cleaning of the present invention, the article for cleaning which has been brought into contact with the composition for cleaning is then brought into contact with a solvent. By bringing the article for cleaning into contact with the solvent, the coordinating compound and the metal complexes thereof which remain attached to the article for cleaning together with the composition for cleaning is removed from the article for cleaning by the rinsing effect of the solvent. In the present invention, the solvent which is brought into contact with the article for cleaning which has been brought into contact with the composition for cleaning is not particularly limited as long as the solvent has compatibility with the hydrocarbon solvent in the composition for cleaning and can dissolve the coordinated compounds. Examples of the solvent include hydrocarbon solvents which can be used in the composition for cleaning as well; alcohol solvents, such as ethanol, isopropanol, and the like; ester solvents, such as ethyl formate, ethyl acetate, and the like; and ketone solvents, such as acetone, methyl ethyl ketone, and the like. The manner in which the article for cleaning is brought into contact with the solvent is not particularly limited, and dipping, spraying, cleaning with vapor, or the like, may be adopted.

The composition for cleaning of the present invention can be considered to exhibit the particularly excellent effect for cleaning a printed circuit board to which residue of a flux is attached because the coordinating compound interacts with metal compounds present on the printed circuit board and in the residue of a flux, to form complexes soluble in a hydrocarbon solvent, and thus increases solubility of the residue.

To summarize the advantages of the invention, according to the composition for cleaning and the process for cleaning of the present invention, residue of a flux on a printed circuit board can be dissolved and removed efficiently without using any organic halogenated solvent which causes destruction of the ozonosphere.

EXAMPLES

The invention will be understood more readily with reference to the following examples; however, these examples are intended to illustrate the invention and are not to be construed to limit the scope of the invention.

Example 1

A small printed circuit board [a product of San Hayato Co., Ltd.; ICB-86G; size, 36×46 mm] was coated twice with 0.2 ml of a flux [a product of Nippon Handa Co., Ltd.; Rapix RA], and left standing for drying. The dried board was soldered in a soldering tank at 260° C., and the product was used as the article for cleaning.

To 1,000 ml of n-hexane, 46.0 g (0.233 mol) of 1-n-octyl-2-pyrrolidinone (NOP) was added and completely dissolved under stirring to prepare a composition for cleaning.

The prepared composition for cleaning in an amount of 75 ml was placed in a stainless steel vessel, which was then dipped into a thermostatted water bath kept at 25° C. When temperature of the composition for cleaning reached 25° C., the article for cleaning was dipped into the composition for cleaning. The article for cleaning was cleaned for 2 minutes under stirring of the composition for cleaning with a stirrer. Then, the article for cleaning was taken out from the vessel, dipped into n-hexane for 30 seconds for rinsing, and then dried with a drier.

The small printed circuit board thus cleaned and dried was dipped into 75 ml of a 75% by volume aqueous solution of isopropyl alcohol, and residue of the flux was extracted with the solution under irradiation of ultrasonic wave for 5 minutes. The electric conductivity of the extract was measured, and found to be 0.85 µS/cm.

Example 2

The same procedures as those in Example 1 were repeated except that 1-n-octyl-2-pyrrolidinone (NOP) was added in an amount of 92.1 g (0.467) in place of 46.0 g (0.233 mol) in Example 1. The electric conductivity of the extract was 0.62 µS/cm.

Example 3

The same procedures as those in Example 1 were repeated except that 59.0 g (0.233 mol) of 1-n-dodecyl-2-pyrrolidinone (NDP) was added in place of 46.0 g (0.233 mol) of 1-n-octyl-2-pyrroldinone (NOP) in Example 1. The electric conductivity of the extract was 0.81 µS/cm.

Example 4

The same procedures as those in Example 3 were repeated except that 1-n-dodecyl-2-pyrrolidinone (NDP) was added in an amount of 118.3 g (0.467 mol) in place of 59.0 g (0.233 mol) in Example 3. The electric conductivity of the extract was 0.65 µS/cm.

Example 5

The same procedures as those in Example 1 were repeated except that 36.0 g (0.093 mol) of tri-n-octylphosphine oxide (TOPO) was added in place of 46.0 g (0.233 mol) of 1-n-octyl-2-pyrrolidinone (NOP) in Example 1. The electric conductivity of the extract was 0.79 µS/cm.

Example 6

The same procedures as those in Example 5 were repeated except that tri-n-octylphosphine oxide (TOPO) was added in an amount of 90.1 g (0.233 mol) in place of 36.0 g (0.093 mol) in Example 5. The electric conductivity of the extract was 0.65 µS/cm.

Example 7

The same procedures as those in Example 5 were repeated except that tri-n-octylphosphine oxide (TOPO) was added in an amount of 180.6 g (0.467 mol) in place of 36.0 g (0.093 mol) in Example 5. The electric conductivity of the extract was 0.59 µS/cm.

Example 8

The same procedures as those in Example 1 were repeated except that 37.8 g (0.233 mol) of di-n-butylsulfoxide (DBSO) was added in place of 46.0 g (0.233 mol) of 1-n-octyl-2-pyrrolidinone (NOP) in Example 1. The electric conductivity of the extract was 0.81 µS/cm.

Example 9

The same procedures as those in Example 8 were repeated except that di-n-butylsulfoxide (DBSO) was added in an amount of 75.8 g (0.467 mol) in place of 37.8 g (0.233 mol) in Example 8. The electric conductivity of the extract was 0.79 µS/cm.

Example 10

The same procedures as those in Example 1 were repeated except that 50.9 g (0.233 mol) of tri-n-butylphosphine oxide (TBPO) was added in place of 46.0 g (0.233 mol) of 1-n-octyl-2-pyrrolidinone (NOP) in Example 1. The electric conductivity of the extract was 0.70 µS/cm.

Example 11

The same procedures as those in Example 1 were repeated except that 1,000 ml of n-dodecane was used in place of 1,000 ml of n-hexane, and 59.0 g (0.233 mol) of 1-n-dodecyl-2-pyrrolidinone (NDP) was added in place of 46.0 g (0.233 mol) of 1-n-octyl-2-pyrrolidinone (NOP) in Example 1. The electric conductivity of the extract was 0.87 µS/cm.

Example 12

The same procedures as those in Example 1 were repeated except that 1,000 ml of 1-dodecene was used in place of 1,000 ml of n-hexane, and 90.1 g (0.233 mol) of tri-n-octylphosphine oxide (TOPO) was added in place of 46.0 g (0.233 mol) of 1-n-octyl-2-pyrrolidinone (NOP) in Example 1. The electric conductivity of the extract was 0.81 µS/cm.

Example 13

The same procedures as those in Example 1 were repeated except that 1,000 ml of decaline was used in place of 1,000 ml of n-hexane, and 1-n-octyl-2-pyrrolidinone (NOP) was added in an amount of 92.1 g (0.467) in place of 46.0 g (0.233 mol) in Example 1. The electric conductivity of the extract was 0.71 µS/cm.

Example 14

The same procedures as those in Example 1 were repeated except that 1,000 ml of Teclean N-20 [a product of Nippon Oil Co., Ltd.; a naphthenic solvent] was used in place of 1,000 ml of n-hexane, and 1-n-octyl-2-pyrrolidinone (NOP) was added in an amount of 92.1 g (0.467) in place of 46.0 g (0.233 mol) in Example 1. The electric conductivity of the extract was 0.75 µS/cm.

Example 15

The same procedures as those in Example 1 were repeated except that 1,000 ml of 1-dodecene was used in place of 1,000 ml of n-hexane, and 1-n-octyl-2-pyrrolidinone (NOP) was added in an amount of 92.1 g (0.467) in place of 46.0 g (0.233 mol) in Example 1. The electric conductivity of the extract was 0.83 µS/cm.

Comparative Example 1

A composition for cleaning containing 95% by weight of CFC-113 and 5% by weight of ethanol in an amount of 75 ml was placed in a stainless steel vessel, which was then dipped into a thermostatted water bath kept at 25° C. When temperature of the composition for cleaning reached 25° C., an article for cleaning which was the same as that used in Example 1 was dipped into the composition for cleaning. The article for cleaning was cleaned for 2 minutes under stirring of the composition for cleaning with a stirrer. Then, the article for cleaning was taken out from the vessel, dipped into CFC-113 for 30 seconds for rinsing, and then dried with a drier.

The small printed circuit board thus cleaned and dried was dipped into 75 ml of a 75% by volume aqueous solution of isopropyl alcohol, and residue of the flux was extracted with the solution under irradiation of ultrasonic wave for 5 minutes. The electric conductivity of the extract was measured, and found to be 0.86 µS/cm.

Comparative Example 2

1,1,1-Trichloroethane in an amount of 75 ml was placed in a stainless steel vessel, which was then dipped into a thermostatted water bath kept at 25° C. When temperature of the composition for cleaning reached 25° C., an article for cleaning which was the same as that used in Example 1 was dipped into the composition for cleaning. The article for cleaning was cleaned for 2 minutes under stirring of the composition for cleaning with a stirrer. Then, the article for cleaning was taken out from the vessel, dipped into 1,1,1-trichloroethane for 30 seconds for rinsing, and then dried with a drier.

The small printed circuit board thus cleaned and dried was dipped into 75 ml of a 75% by volume aqueous solution of isopropyl alcohol, and residue of the flux was extracted with the solution under irradiation of ultrasonic wave for 5 minutes. The electric conductivity of the extract was measured, and found to be 0.88 µS/cm.

Comparative Example 3 n-Hexane in an amount of 75 ml was placed in a stainless steel vessel, which was then dipped into a thermostatted water bath kept at 25° C. When temperature of the composition for cleaning reached 25° C., an article for cleaning which was the same as that used in Example 1 was dipped into the composition for cleaning. The article for cleaning was cleaned for 2 minutes under stirring of the composition for cleaning with a stirrer. Then, the article for cleaning was taken out from the vessel, dipped into n-hexane for 30 seconds for rinsing, and then dried with a drier.

The small printed circuit board thus cleaned and dried was dipped into 75 ml of a 75% by volume aqueous solution of isopropyl alcohol, and residue of the flux was extracted with the solution under irradiation of ultrasonic wave for 5 minutes. The electric conductivity of the extract was measured, and found to be 1.81 µS/cm.

Comparative Example 4

An article for cleaning which was the same as that used in Example 1 was dipped into 75 ml of a 75% by volume aqueous solution of isopropyl alcohol directly without cleaning with a cleaning agent, and residue of the flux was extracted with the solution under irradiation of ultrasonic wave for 5 minutes. The electric conductivity of the extracted solution was measured, and found to be 2.37 µS/cm.

The results of Examples 1 to 15 and Comparative Examples 1 to 4 are shown together in Table 1.

TABLE 1

| | hydrocarbon solvent | | coordinating compound | | | electric conductivity (µS/cm) | effect of cleaning |
|---|---|---|---|---|---|---|---|
| | type | amount (ml) | type | amount (mol) | (g) | | |
| Example 1 | n-hexane | 1,000 | NOP | 0.233 | 46.0 | 0.85 | Δ |
| Example 2 | n-hexane | 1,000 | NOP | 0.467 | 92.1 | 0.62 | ○ |
| Example 3 | n-hexane | 1,000 | NDP | 0.233 | 59.0 | 0.81 | ○ |
| Example 4 | n-hexane | 1,000 | NDP | 0.467 | 118.3 | 0.65 | ○ |
| Example 5 | n-hexane | 1,000 | TOPO | 0.093 | 36.0 | 0.79 | ○ |
| Example 6 | n-hexane | 1,000 | TOPO | 0.233 | 90.1 | 0.65 | ○ |
| Example 7 | n-hexane | 1,000 | TOPO | 0.467 | 180.6 | 0.59 | ○ |
| Example 8 | n-hexane | 1,000 | DBSO | 0.233 | 37.8 | 0.81 | ○ |
| Example 9 | n-hexane | 1,000 | DBSO | 0.467 | 75.8 | 0.79 | ○ |
| Example 10 | n-hexane | 1,000 | TBPO | 0.233 | 50.9 | 0.70 | ○ |
| Example 11 | n-dodecane | 1,000 | NDP | 0.233 | 59.0 | 0.87 | Δ |
| Example 12 | 1-dodecene | 1,000 | TOPO | 0.233 | 90.1 | 0.81 | ○ |
| Example 13 | decaline | 1,000 | NOP | 0.467 | 92.1 | 0.71 | ○ |
| Example 14 | Teclean N-20 | 1,000 | NOP | 0.467 | 92.1 | 0.75 | ○ |
| Example 15 | 1-dodecene | 1,000 | NOP | 0.467 | 92.1 | 0.83 | ○ |
| Comparative Example 1 | CFC-113 (95% by weight) + ethanol (5% by weight) | | | | | 0.86 | — |
| Comparative Example 2 | 1,1,1-trichloroethane | | | | | 0.88 | — |
| Comparative Example 3 | n-hexane | | | | | 1.81 | x |
| Comparative Example 4 | no cleaning | | | | | 2.37 | x |

Note:
NOP: 1-n-octyl-2-pyrrolidinone
NDP: 1-n-dodecyl-2-pyrrolidinone
TOPO: tri-n-octylphosphine oxide
DBSO: di-n-butylsulfoxide
TBPO: tri-n-butylphosphine oxide
Teclean N-20: a product of Nippon Oil Co., Ltd., a naphthenic solvent The electric conductivity of an extract can be regarded as an index representing the amount of residue of the flux remaining on the printed circuit board after the cleaning. A smaller value of the electric conductivity shows that residue of the flux has been cleaned to a better extent. The results of the measurements of the electric conductivity of the extracts are shown together in Table 1. In Table 1, the effect of cleaning is indicated according to the following classification wherein the cleaning effect was compared with that of a conventional cleaning agent, such as CFC-113 or 1,1,1-trichloroethane:

○: better

Δ: about the same x: inferior

In Comparative Example 1 in which the article for cleaning was treated with a cleaning agent comprising, as the main component thereof, a chlorofluorocarbon solvent (CFC-113) which is a conventional organic halogenated solvent, and in Comparative Example 2 in which the article for cleaning was treated with a cleaning agent comprising, as the main component thereof, 1,1,1-trichloroethane which is a conventional organic halogenated solvent, the electric conductivities of the extracts were 0.86 and 0.88 µS/cm, respectively. In Comparative Example 3 in which the article for cleaning was treated only with n-hexane which is a type of hydrocarbon solvent, the electric conductivity of the extract was 1.81 µS/cm. The result shows that the cleaning effect was inferior in this case. In contrast, in Examples 1 to 10 in which the compositions for cleaning of the present invention comprising a coordinating compound in addition to n-hexane in an amount to make the concentration 0.093 to 0.0467 mol/liter was used, the effect of cleaning was remarkably increased, and an effect of cleaning which is equal to or better than that of the conventional cleaning agents could be obtained. When a hydrocarbon solvent other than n-hexane, such as n-dodecane (Example 11), 1-dodecene (Examples 12 and 15), decaline (Example 13), or a naphthenic solvent (Example 14), was used, an effect of cleaning which is equal to or higher than that of the conventional cleaning agents could be obtained by adding a coordinating compound.

Comparative Example 5

The same procedures as those in Example 1 were repeated except that 23.4 g (0.233 mol) of cyclohexanol was added in place of 46.0 g (0.233 mol) of 1-n-octyl-2-pyrrolidinone (NOP) in Example 1. The electric conductivity of the extract was 1.41 µS/cm.

Comparative Example 6

The same procedures as those in Comparative Example 5 were repeated except that cyclohexanol was used in an amount of 73.3 g (0.732) in place of 23.4 g (0.233 mol) in Comparative Example 5. The content of cyclohexanol in the mixed solution was 10% by weight. The electric conductivity of the extract was 1.19 µS/cm.

Comparative Example 7

The same procedures as those in Example 1 were repeated except that 31.3 g (0.233 mol) of diethylene glycol monoethyl ether was added in place of 46.0 g (0.233 mol) of 1-n-octyl-2-pyrrolidinone (NOP) in Example 1. The electric conductivity of the extract was 1.27 µS/cm.

Comparative Example 8

The same procedures as those in Example 11 were repeated except that 23.4 g (0.233 mol) of cyclohexanol was added in place of 59.0 g of 1-n-dodecyl-2-pyrrolidinone (NDP) in Example 11. The electric conductivity of the extract was 1.50 µS/cm.

Comparative Example 9

The same procedures as those in Example 11 were repeated except that 31.3 g (0.233 mol) of diethylene glycol monoethyl ether was added in place of 59.0 g of 1-n-dodecyl-2-pyrrolidinone (NDP) in Example 11. The electric conductivity of the extract was 1.42 µS/cm.

The results of Comparative Examples 5 to 9 are shown together in Table 2.

TABLE 2

| | hydrocarbon solvent | | added compound | | | electric conductivity |
|---|---|---|---|---|---|---|
| | type | amount (ml) | type | amount (mol) | (g) | (µS/cm) |
| Comparative Example 5 | n-hexane | 1,000 | cyclohexanol | 0.233 | 23.4 | 1.41 |
| Comparative Example 6 | n-hexane | 1,000 | cyclohexanol | 0.732 | 73.3 | 1.19 |
| Comparative Example 7 | n-hexane | 1,000 | diethylene glycol monoethyl ether | 0.233 | 31.3 | 1.27 |
| Comparative Example 8 | n-dodecane | 1,000 | cyclohexanol | 0.233 | 23.4 | 1.50 |
| Comparative Example 9 | n-dodecane | 1,000 | diethylene glycol monoethyl ether | 0.233 | 31.3 | 1.42 |

It can be understood that in Comparative Examples 5 and 7 in which a cleaning agent prepared by adding 0.233 mol of cyclohexanol or diethylene glycol monoethyl ether in place of a coordinating compound to 1,000 mol of n-hexane was used, the electric conductivity of the extract was higher, and cleaning of residue of the flux was insufficient in comparison with those in Examples 1, 3, 6, 8, and 10 in which a composition for cleaning prepared by adding the same amount in mol of a coordinating compound was used. Furthermore, in Comparative Example 6 in which a larger amount of cyclohexanol was added and the content of cyclohexanol in the cleaning agent was increased to 10% by weight, improvement of the effect of cleaning was not significant, and the effect of cleaning was inferior to that of conventional organic halogenated solvents. In Comparative Examples 8 and 9 in which the hydrocarbon solvent in the cleaning agent was changed from n-hexane to n-dodecane, the electric conductivities of the extracts were rather higher than those in Comparative Examples 5 and 7. These results show that, even when n-dodecane was used as the solvent, a sufficient effect of cleaning could not be obtained by the combination with cyclohexanol or diethylene glycol monoethyl ether.

What is claimed is:

1. A cleaning process which comprises (a) contacting a printed circuit board to which a residue of a flux is attached with a cleaning composition comprising: (i) a first solvent, said first solvent being an aliphatic hydrocarbon solvent having 5 to 20 carbon atoms and (ii) an organic compound selected from the group consisting of a 1-alkyl-2-pyrrolidinone having 3 to 18 carbon atoms, a tri-alkylphosphine oxide having 3 to 18 carbon atoms and a di-alkylsulfoxide having 3 to 18 carbon atoms, wherein said organic compound is in an amount of 10 to 300 g per liter of said hydrocarbon solvent, said cleaning composition not containing a halogen compound, and (b) subsequently contacting the printed circuit board to which a residue of a flux is attached with a second solvent.

2. The process according to claim 1, wherein said aliphatic hydrocarbon solvent is a naphthenic hydrocarbon; said organic compound is a 1-alkyl-2-pyrrolidinone having an alkyl chain of 3 to 18 carbon atoms; and said 1-alkyl-2-pyrrolidinone being in an amount of 30 to 250 g per 1 liter of said naphthenic hydrocarbon.

3. The process according to claim 1, wherein said aliphatic hydrocarbon solvent is a naphthenic hydrocarbon; said organic compound is a trialkylphosphine oxide having an alkyl chain of 3 to 18 carbon atoms; and said trialkylphosphine oxide being in an amount of 30 to 250 g per 1 liter of said napthenic hydrocarbon.

4. The process according to claim 1, wherein said aliphatic hydrocarbon solvent is a naphthenic hydrocarbon; said organic compound is a dialkylsulfoxide having an alkyl chain of 3 to 18 carbon atoms; and said dialkylsulfoxide being in an amount of 30 to 250 g per 1 liter of said napthenic hydrocarbon.

5. The cleaning process according to claim 1, wherein said aliphatic hydrocarbon solvent is selected from the group consisting of n-pentane, n-hexane, isohexane, n-heptane, isoheptane, isooctane, decane, dodecane, hexadecane, icosan, 1-decene, 1-dodecene, cyclohexane, decalin, limonene, pinene, benzene, toluene, xylene, ethylbenzene, tetralin, petroleum benzine, ligroin and naphtha.

6. The cleaning process according to claim 5, wherein said organic compound is selected from the group consisting of 1-n-octyl-2-pyrrolidinone, 1-n-dodecyl-2-pyrrolidinone, tri-n-octylphosphine oxide, di-n-butylsulfoxide and tri-n-butylphosphine oxide.

7. The cleaning process according to claim 1, wherein said organic compound is selected from the group consisting of 1-n-octyl-2-pyrrolidinone, 1-n-dodecyl-2-pyrrolidinone, tri-n-octylphosphine oxide, di-n-butylsulfoxide and tri-n-butylphosphine oxide.

8. The cleaning process according to claim 7, wherein said organic compound is in an amount of 30 to 250 g per liter of said hydrocarbon solvent.

9. The cleaning process according to claim 1, wherein said organic compound is in an amount of 30 to 250 g per liter of said hydrocarbon solvent.

10. The cleaning process according to claim 1, wherein said organic compound is a $1-C_3-C_{18}$-alkyl-2-pyrrolidinone.

11. The cleaning process according to claim 1, wherein said organic compound is a tri-$C_3$-$C_{18}$-alkylphosphine oxide.

12. The cleaning process according to claim 1, wherein said organic compound is a di-$C_3$-$C_{18}$-alkyl sulfoxide.

13. The cleaning process according to claim 1, wherein the second solvent is selected from the group consisting of ethanol, isopropanol, ethyl formate, ethyl acetate, acetone and methyl ethyl ketone.

\* \* \* \* \*

UNITED STATES PATENT AND TRADEMARK OFFICE
CERTIFICATE OF CORRECTION

PATENT NO.     : 5,767,048
DATED          : June 16, 1998
INVENTOR(S)    : Hiroshi Obuse It is certified that error appears in the above-identified patent and that said Letters Patent is hereby corrected as shown below:

Column 12,
Line 10, replace "5" with -- 1 --.
Line 15, replace "1" with -- 5 --.
Line 20, replace "7" with -- 6 --.

Signed and Sealed this

Twenty-fifth Day of June, 2002

Attest:

Attesting Officer

JAMES E. ROGAN
*Director of the United States Patent and Trademark Office*